US009535782B2

(12) United States Patent
Agrawal et al.

(10) Patent No.: US 9,535,782 B2
(45) Date of Patent: Jan. 3, 2017

(54) METHOD, APPARATUS AND SYSTEM FOR HANDLING DATA ERROR EVENTS WITH A MEMORY CONTROLLER

(71) Applicant: Intel Corporation, Santa Clara, CA (US)

(72) Inventors: Anil Agrawal, Cupertino, CA (US); Satish Muthiyalu, Bangalore (IN); Yingwen Chen, Shanghai (CN); Meera Ganesan, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/428,338

(22) PCT Filed: Apr. 16, 2014

(86) PCT No.: PCT/CN2014/075472
§ 371 (c)(1),
(2) Date: Mar. 13, 2015

(87) PCT Pub. No.: WO2015/157932
PCT Pub. Date: Oct. 22, 2015

(65) Prior Publication Data
US 2016/0004587 A1 Jan. 7, 2016

(51) Int. Cl.
*G06F 11/00* (2006.01)
*G06F 11/07* (2006.01)
(Continued)

(52) U.S. Cl.
CPC ......... *G06F 11/0793* (2013.01); *G06F 3/0614* (2013.01); *G06F 3/0652* (2013.01);
(Continued)

(58) Field of Classification Search
USPC ................................. 714/6.11, 6.1
See application file for complete search history.

(56) References Cited

U.S. PATENT DOCUMENTS 5,263,032 A 11/1993 Porter et al.
7,325,078 B2 * 1/2008 Walker .................. G06F 3/0604
710/7

(Continued)

FOREIGN PATENT DOCUMENTS

CN 102473126 5/2012
EP 1031992 3/1990
TW I320853 2/2010

OTHER PUBLICATIONS

"PCT, International Search Report and the Written Opinion of the Interantional Searching Authority for International Application No. PCT/CN2014/075472", (Jan. 21, 2015), Whole Document.

(Continued)

*Primary Examiner* — Sarai Butler
(74) *Attorney, Agent, or Firm* — Blakely, Sokoloff, Taylor & Zafman LLP

(57) ABSTRACT

Techniques and mechanisms for providing error detection and correction for a platform comprising a memory including one or more spare memory segments. In an embodiment, a memory controller performs first scrubbing operations including detection for errors in a plurality of currently active memory segments. Additional patrol scrubbing is performed for one or more memory segments while the memory segments are each available for activation as a replacement memory segment. In another embodiment, a first handler process (but not a second handler process) is signaled if an uncorrectable error event is detected based on the active segment scrubbing, whereas the second handler process (but not the first handler process) is signaled if an uncorrectable error event is detected based on the spare segment scrubbing. Of the first handler process and the second handler process, only signaling of the first handler process results in a crash event of the platform.

25 Claims, 11 Drawing Sheets

(51) Int. Cl.
*G11C 29/52* (2006.01)
*G06F 3/06* (2006.01)
*G11C 29/04* (2006.01)

(52) U.S. Cl.
CPC .......... *G06F 3/0673* (2013.01); *G06F 11/073* (2013.01); *G06F 11/079* (2013.01); *G06F 11/0751* (2013.01); *G11C 29/52* (2013.01); *G11C 2029/0409* (2013.01)

(56) References Cited

U.S. PATENT DOCUMENTS

| | | | |
|---|---|---|---|
| 7,334,159 B1 | 2/2008 | Callaghan | |
| 7,913,147 B2 | 3/2011 | Swaminathan et al. | |
| 8,060,774 B2* | 11/2011 | Smith | G06F 11/1076 |
| | | | 714/6.22 |
| 8,122,308 B2 | 2/2012 | Buch | |
| 2002/0016942 A1 | 2/2002 | MacLaren et al. | |
| 2003/0070113 A1* | 4/2003 | Ferguson | H04L 1/22 |
| | | | 714/5.11 |
| 2004/0205433 A1 | 10/2004 | Gower et al. | |
| 2007/0089032 A1 | 4/2007 | Alexander et al. | |
| 2009/0055681 A1* | 2/2009 | Dholakia | G06F 11/1076 |
| | | | 714/6.13 |
| 2013/0128666 A1 | 5/2013 | Avila et al. | |
| 2014/0089725 A1* | 3/2014 | Ackaret | G06F 12/0653 |
| | | | 714/6.1 |

OTHER PUBLICATIONS

Non-Final Office Action for Taiwan Patent Application No. 104108096 mailed Mar. 30, 2016, 3 pgs., no English translation.

\* cited by examiner

Memory Controller 200

Memory Sparer Logic 210

- Bad Segment Detection Logic 212
  - Error Threshold 214
- Segment Lookup/Replace Logic 220
- Segment Remap Logic 222
- Handler Invocation Logic 224

Memory Scrubber Logic 230

- Error Detection Logic 232
- Error Correction Logic 234

METHOD, APPARATUS AND SYSTEM FOR HANDLING DATA ERROR EVENTS WITH A MEMORY CONTROLLER

CLAIM OF PRIORITY

This application claims the benefit of priority of International Patent Application No. PCT/CN2014/075472, filed Apr. 16, 2014, titled "METHOD, APPARATUS AND SYSTEM FOR HANDLING DATA ERROR EVENTS WITH A MEMORY CONTROLLER", which is incorporated by reference in its entirety.

BACKGROUND

1. Technical Field

Embodiments of the invention generally relate to the field of computer memory and more particularly, but not exclusively, to handling of an error in a memory device.

2. Background Art

In today's computing world, maintaining good computer system reliability and uptime is often important or even mandatory. To maintain significant computer uptime, system designers build reliability, availability, serviceability, manageability (RASM) features to improve overall system reliability and availability. Thus, it is common to find various degrees of redundancy, error correction, error detection and error containment techniques employed at different levels in such a system.

One of the most common types of computer system failure is attributed to system memory errors. Memory devices are susceptible to errors such as transient (or soft) errors. If these errors are not handled properly, they can cause a computing system to malfunction. Hence, the memory subsystem (especially dual in-line memory modules or DIMMs) receives particular attention in this regard. For example, redundant information in the form of error correcting codes (ECCs) or other such error correction information can be used in memory scrubbing operations to improve overall system reliability. Demand memory scrubbing is one error detection/correction technique wherein errors in a memory segment, whether single-bit or multi-bit errors, can be detected in the course of operation to service a host operating system's requests to access the memory segment. By contrast, another RASM technique known as patrol memory scrubbing pro-actively scans a memory segment for errors before, or otherwise independent of, any such host operating system requests to access the memory segment.

Another RAS technique—known as "memory sparing"—allocates one or more memory segments each to be available for service as a spare segment in the event of an actual or expected future failure of an in-use (or "active") memory segment. When error detection or other mechanisms indicate such failure of an in-use memory segment, a spare memory segment is allocated to serve as a successor to (substitute for) the failed/failing segment. The system memory map is updated to associate addresses—e.g. a range of addresses—with memory locations of the successor segment, where previously such addresses were mapped to variously identify respective locations of the failed/failing active segment.

BRIEF DESCRIPTION OF THE DRAWINGS

The various embodiments of the present invention are illustrated by way of example, and not by way of limitation, in the figures of the accompanying drawings and in which:

FIG. 2 is a functional block diagram illustrating elements of a memory controller to signal memory error events according to an embodiment.

DETAILED DESCRIPTION

Figure 1:
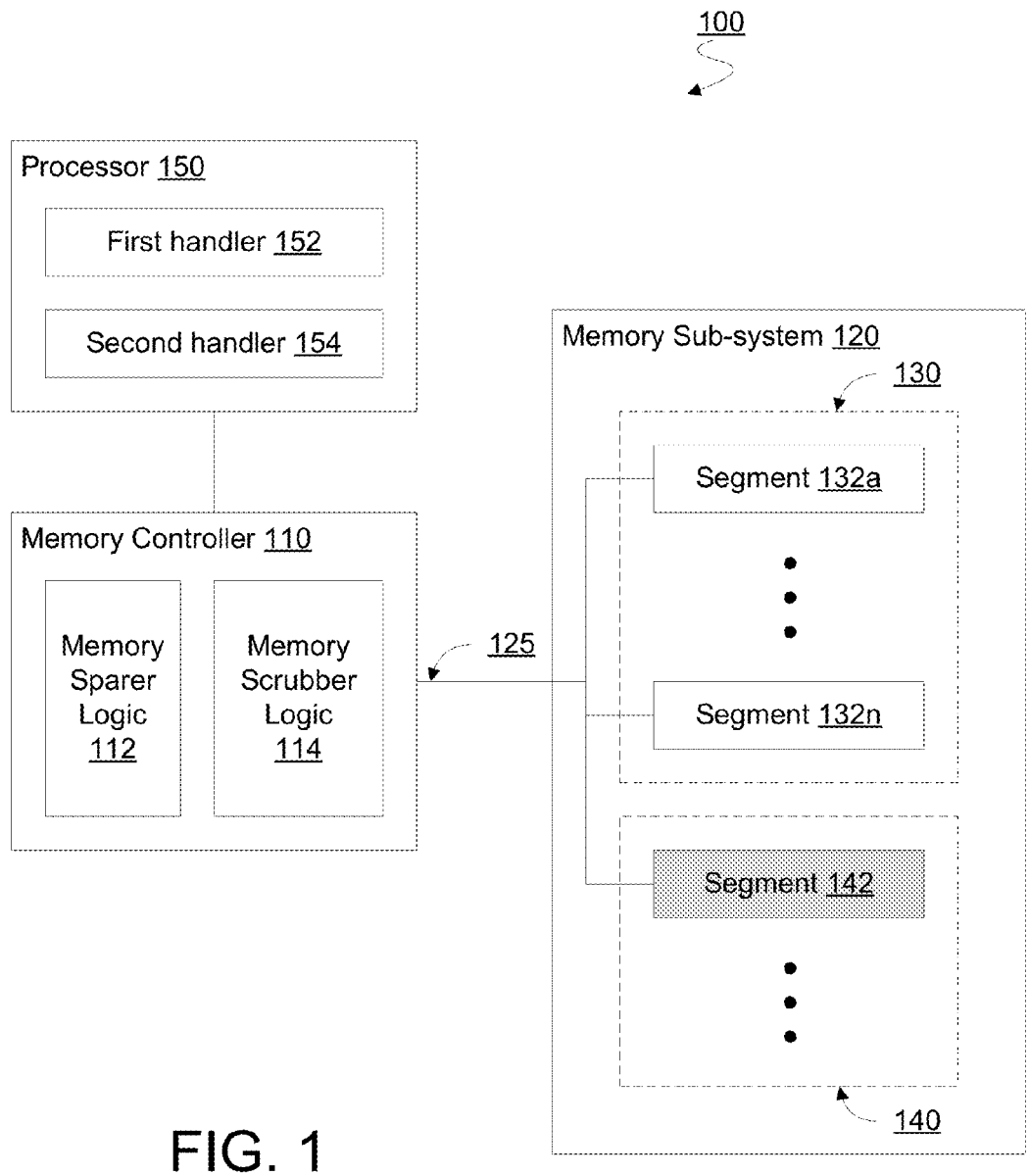
FIG. 1 is a functional block diagram illustrating elements of a computer platform for providing access to memory segments according to an embodiment.

Embodiments discussed herein variously provide for error detection in a platform including one or more spare memory segments. As used herein, "memory segment" refers to a unit of memory hardware which, in one or more respects, may be operated independently of similar memory hardware units. A memory segment may comprise a rank, bank or other memory hardware component—e.g. wherein the component includes multiple, variously-addressable memory locations. A memory segment may include, or couple to, interface hardware dedicated to coupling only that segment, and not one or more other memory segments, with a bus or other interconnect coupled between that segment and a memory controller. Alternatively or in addition, the memory segment may include a dedicated chip enable input, address decoder or other logic. Features of certain embodiments are discussed herein with respect to variously implementing memory scrubbing and/or memory sparing for individual memory ranks. However, such discussion may be extended to additionally or alternatively apply to any of a variety of other types of memory segments.

A given memory segment may be classified as either active or spare—e.g. based on whether a host operating system (OS) or other agent is currently able to access that memory segment. A spare segment may be available for eventual activation to serve as a replacement for another memory segment which has been identified as a failed segment of a failing segment. For brevity, such a segment is referred to herein as "failed/failing." Scrubbing operations may be variously performed according to different embodiments to detect—and in some embodiments, correct—errors in one or more segments of memory. Certain embodiments are not limited with respect to the particular means by which ECCs or other such error correction information are variously calculated, stored and subsequently retrieved for use in performing an individual error detection calculation. The particular details of such means, which may be adapted from conventional error detection/correction techniques and mechanisms, are not discussed herein to avoid obscuring features of such embodiments.

Scrubbing of a spare memory segment may be performed based on placeholder data (and corresponding error correction information) which, for example, a memory controller and/or memory device may store in the spare memory segment—e.g. independent of a host OS or other requestor agent. During such scrubbing of the spare segment, the spare segment may be invisible to (for example, unregistered with) the host OS or other such requestor agent which has access to the currently active memory segments.

Though modern memory employs error correction code (ECC) to detect and/or correct single and double-bit errors, higher order multi-bit errors still pose a significant problem for system reliability and availability. Error detection mechanisms often include functionality to classify an error as being one of a correctable error or an uncorrectable error. Conventional error handling techniques variously respond to an uncorrectable errors in memory by initiating machine check operations of an operating system. Such operations include performance of a system-wide shutdown.

Typically, conventional memory scrubbing technologies do not even support scrubbing of spare memory, much less provide different respective error handling mechanisms for active segments and spare segments. By contrast, certain embodiments provide for signaling of different handler processes based on whether (or not) a memory segment associated with a detected error event is currently designated an active segment or a spare segment. For example, an error detected for an active segment may result in a machine check exception or other such invocation of an exception handler. By contrast, an error event associated with a spare segment may result in signaling of a different type of event handler such as an interrupt handler. In an embodiment, a spare segment error event results in event handling operations performed during a system management mode of a processor—e.g. whereas an active segment error event may instead result in operations executed by a host OS during a different mode of the processor. Additionally or alternatively, an active segment error event may result in event handling operations causing a platform-wide reset, crash or other such "blue screen" event. A spare segment error event may instead allow for event handling operations to be completed independent of any need to reboot or otherwise restart software execution by the platform.

FIG. 1 illustrates elements of a system 100 implemented according to an embodiment. System 100 represents any of a number of computing systems—e.g. including servers, desktops, laptops, mobile devices, smartphones, gaming devices, and others—which variously support error detection functionality and memory sparing functionality as discussed herein.

System 100 may include a memory sub-system 120 coupled to a memory controller 110 via one or more data, command, address and/or other signal lines (as represented by the illustrative interconnect 125)—e.g. where memory controller 110 is to control, at least in part, a transfer of information between a requester and memory sub-system 120. For example, such a requester may be a processor 150 (e.g., a central processing unit, graphics processor, service processor, processor core and/or the like) or, alternatively, an input/output device (e.g., a peripheral component interconnect (PCI) Express device), memory itself, or any other element of system 100 that requests access to memory. In some embodiments, memory controller 110 is on the same integrated circuit (IC) die as that which includes the requester.

Memory sub-system 120 may include any of a variety of types of memory segments that, for example, have respective rows of memory cells, where data is accessible via a wordline or the equivalent. In one embodiment, memory sub-system 120 includes dynamic random access memory (DRAM) technology such as that which operates according to a Dual Data Rate (DDR) specification, a Low Power DDR (LPDDR) specification or other such memory standard. Memory sub-system 120 may be an integrated circuit package within a larger memory device (not shown) of system 100. For example, memory sub-system 120 may be a DRAM device of a memory module such as a dual in-line memory module (DIMM).

Memory controller 110 may include logic—e.g. including any of a variety of hardware logic and/or executing software logic—to send commands via interconnect 125 to variously read from, write to or otherwise access one or more segments of memory sub-system 120. One or more such commands may be sent by memory controller 110 according to one or more conventional techniques for accessing a memory. The particular details of such conventional techniques, which are not limiting on certain embodiments, are not described herein to avoid obscuring such embodiments.

By way of illustration and not limitation, memory controller 110 may comprise logic to provide command/address signaling functionality which, for example, conforms to some or all requirements of a dual data rate (DDR) specification such as the DDR3 Synchronous Dynamic Random Access Memory (SDRAM) Joint Electron Device Engineering Council (JEDEC) Standard JESD79-3C, April 2008, the DDR4 SDRAM JEDEC Standard JESD79-4, September 2012, or other such specification.

In an illustrative embodiment, memory sub-system 120 includes segments 130 which—at a given time—are currently "active"—i.e. allocated for use to store information on behalf of one or more requestors. Such allocation may be managed at least in part by memory controller 110. At a given time, segments 130 may include a particular plurality of segments, as represented by the illustrative segments 132a, . . . , 132n, where the population of active segments 130 may change as segments are variously activated (e.g. transitioned from being available as a spare segment) or deactivated (e.g. disabled) during operation of memory sub-system 120.

Memory controller 110 and memory sub-system 120 operate to implement error detection/correction functionality. For example, memory controller 140 may include memory scrubber logic 114, comprising any of a variety of combinations of hardware and/or executing software, which is to variously perform demand scrubbing and/or patrol scrubbing of the current population of active segments 130. By way of illustration and not limitation, memory sub-system 120 may, under control by memory controller 110, variously store in different ones of segments 130 respective data bits and corresponding error check bits—e.g., error correction code (ECC) bits. Based on such error check bits, memory scrubber logic 114 may perform calculations to determine whether corresponding data, previously stored to memory sub-system 120, is now in a corrupted state.

Memory controller 110 may further comprise memory sparer logic 112, including any of a variety of combinations of hardware and/or executing software, to identify—e.g. responsive to memory scrubber logic 114—whether a given one of active segments 130 is to be classified as a failed (and/or failing) segment. For example, based on one or more indications from memory scrubber logic 114, memory sparer logic 112 may detect, for a given one of active segments 130, some threshold error event—e.g. including a threshold number of errors being reached, a threshold frequency of errors being reached, or the like—indicating a need to replace that segment with one of the one or more spare segments 140.

In response to detecting some threshold error event, memory sparer logic 112 may signal an event handler process—e.g. a first handler 152 executing or to be executed with processor 150—to implement, track or otherwise support memory sparing operations to remove a failed/failing segment from the current population of active segments 130, and to transition one of the current one or more spare segments 140 into the population of active segments 130. First handler 152 may include, for example, a host operating system (OS) process such as one to perform a machine check operations.

In an embodiment, memory scrubber logic 114 includes additional (or the same) logic to further perform patrol scrubbing of the current population of one or more segments 140 which are each available to serve as a spare in the case of an active segment being identified as failed or failing. Scrubbing of the one or more spare segments 140 may include features of scrubbing performed for active segments 130, for example.

Memory sparer logic 112 may further perform operations, responsive to such patrol scrubbing of the current spare segment 142, to detect whether spare segment 142 is to be classified as a failed/failing segment. For example, in response to detecting a threshold error event, memory sparer logic 112 may signal some other event handler process—e.g. a second handler 154 executing or to be executed with processor 150—to implement, track or otherwise support removing a failed/failing segment from the current population of one or more spare segments 140. Second handler 154 may include, for example, an interrupt handler process of a system management mode (SMM)—e.g. where the SMM mode is to be distinguished from an alternative mode of processor 150 for execution of a general-purpose host OS which implements first handler 152.

FIG. 2 show elements of a memory controller 200 to perform memory sparing and error detection according to an embodiment. Memory controller 200 may include one or more features of memory controller 110. For example, memory controller 200 includes memory sparer logic 210 and memory scrubber logic 230 which may provide some or all of the functionality of memory sparer logic 112 and memory scrubber logic 114, respectively.

In an embodiment, memory scrubber logic 230 includes circuit logic—as represented by the illustrative error detection logic 232—to variously calculate whether data stored in segments of a memory (not shown) includes errors. In some embodiments, memory scrubber logic may further include error correction logic 234 to variously correct some or all such errors. Operation of error detection logic 232 and error correction logic 234 may include performance of one or more processes adapted from conventional error detection/correction techniques. The particular details of such conventional techniques are not limiting on some embodiments, and are not discussed herein to avoid obscuring various features of such embodiments.

Memory sparer logic 210 may include bad segment detection logic 212, bad segment lookup and replacement (L/R) logic 220, and segment remap logic 222. The bad segment detection may be implemented in several ways. For example, bad segment detection logic 212 may, based on exchanges with memory scrubber logic 230, keep track of the segments of memory that return bad data during memory transactions. For example, a memory request to an address in memory may arrive at memory controller 200. The request is then sent to system memory (not shown) and the memory may return ECC information. The ECC information may be evaluated by error detection logic 232 of memory scrubber logic 230 to determine whether there was an error with the transaction at the memory segment at the target address. If an error has occurred, bad segment detection logic 212 may keep track of the transaction and the result. Alternatively or in addition, bad segment detection logic 212 may keep track of bad data returned during scrubbing of memory segments (e.g. whether active segments or spare segments). Where a given error is identified as being correctable (e.g. given the error correction mechanisms available to memory controller), error correction logic 234 of memory scrubber logic 230 may perform calculations to generate a revised—i.e. corrected—version of the requested data.

In an embodiment, bad segment detection logic 212 may include or otherwise have access to an error threshold 214—e.g. including a maximum threshold error number, maximum threshold error number, threshold error type and/or the like—which is accessed to determine whether a particular segment under consideration violates error threshold 214. Where such violation of error threshold 214 is indicated, memory sparing may be performed. By way of illustration and not limitation, where an active segment is identified as failed/failing, segment L/R logic 220 may perform operations to identify a spare segment to be activated for service as a replacement segment. In some embodiments, segment remap logic 222 may determine memory map updating which is to be implemented in support of a deactivating a failed/failing active segment and/or an activating of a selected spare segment.

Detection of a failed or failing segment may further comprise some logic of memory controller—represented by the illustrative handler invocation logic 224—signaling to a handler that event handling operations are to be performed. In an embodiment, handler invocation logic 224 invokes different handlers, according to whether a detected failed/failing segment is an active segment or a spare segment. For example, handler invocation logic 224 may invoke a first handler, rather than a second handler, based on the failed/failing segment being active. By contrast, handler invocation logic 224 may instead invoke the second handler, and not the first handler, where the failed/failing segment is a spare segment.

Figure 3:
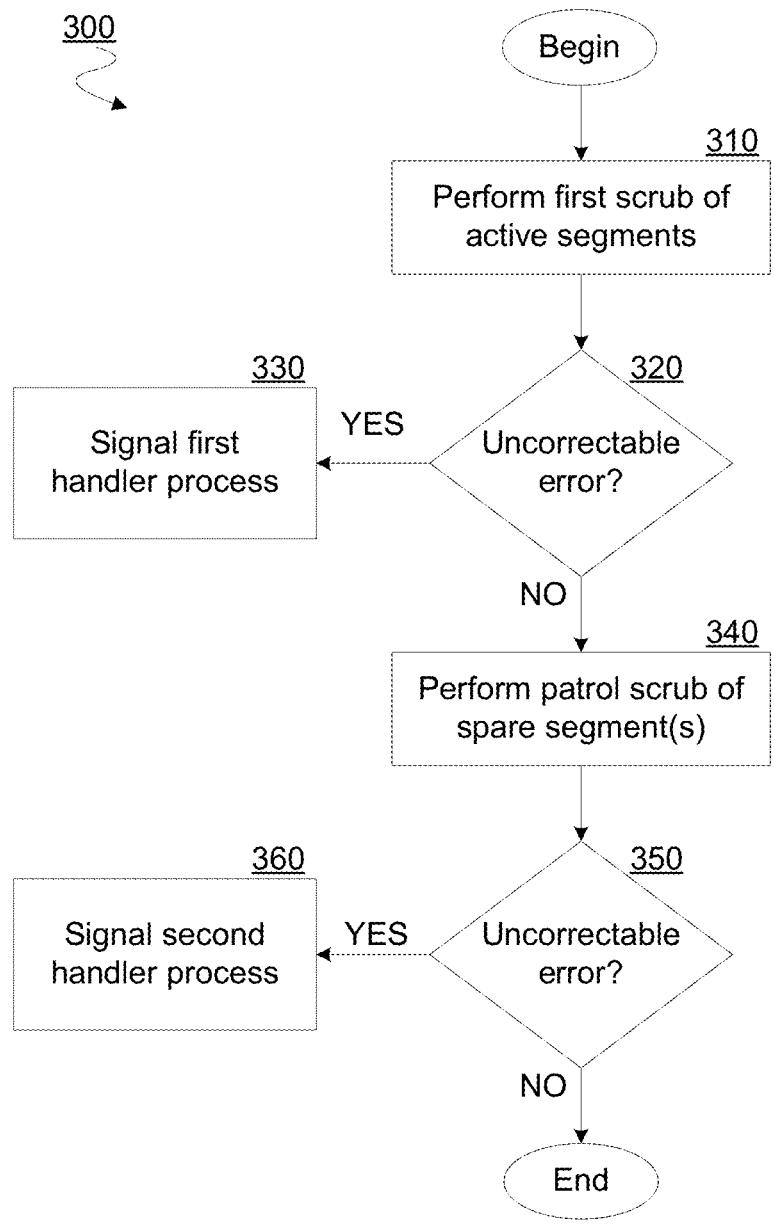
FIG. 3 is a flow diagram illustrating elements of a method for invoking operations to handle a memory error event according to an embodiment.

FIG. 3 illustrates elements of a method 300 for controlling a memory according to an embodiment. Method 300 may be performed to manage segments of a memory such as memory sub-system 120—e.g. where method 300 is performed with memory controller 110.

Method 300 may include, at 310, performing a first scrub of a plurality of (only) active memory segments. The first scrub performed at 310 may include demand scrub operations and/or patrol scrub operations. In an embodiment, the first scrub at 310 includes classifying some detected error. For example, the first scrub may include classifying an error as being either correctable or uncorrectable. Alternatively or in addition, the first scrub at 310 may include determining whether some threshold error event has occurred—e.g. in addition to or other than any uncorrectable error event.

If it is determined, at 320, that the first scrub detects an uncorrectable error, then method 300 may, at 330, signal a first handler process to perform one or more event handler operations. Although certain embodiments are not limited in this regard, the first handler may be executed by a host OS—e.g. during a general-purpose mode of a host processor. The first handler process may include, invoke or otherwise implement, for example, any of a variety of operations in support of memory sparing. By way of illustration and not limitation, the first handler process may include or result in one or more of a signaling of a hardware error to invoke a machine check, a resetting of the machine (e.g. a "blue screen" event), poisoning one or more cache lines, notifying a host OS to off-line one or more memory pages corresponding to the failed/failing segment, etc.

If no uncorrectable error event is indicated at 320, then method 300 may, at 340, perform patrol scrubbing of one or more spare ranks of the memory. In another embodiment, the patrol scrubbing at 340 is performed independent of the evaluation at 320—e.g. wherein some or all of the patrol scrubbing at 340 is performed according to a predetermined schedule. Similar to the first scrub at 310, the patrol scrub at 340 may include classifying an error as correctable (or as uncorrectable) and/or detecting for any occurrence of one or more threshold error events.

If it is determined, at 350, that the patrol scrub at 340 detects an uncorrectable error, then method 300 may, at 360, signal a second handler process to perform one or more event handler operations. In one embodiment, the first handler may—of the first handler process and the second handler process—be the only process signaled in response to the uncorrectable error detected at 350. Alternatively or in addition, the first handler process may—of the first handler process and the second handler process—be the only handler process signaled in response to the uncorrectable error detected at 320.

Although certain embodiments are not limited in this regard, the second handler process may be executed in a SMM of a processor. The second handler process may include, invoke or otherwise implement, for example, any of a variety of operations in support of removing a segment from the pool of available spare segments. By way of illustration and not limitation, the second handler process may include or result in one or more of updating segment L/R logic 220 (or other such logic) to reflect that the failed/failing spare segment is disabled and/or no longer available. Alternatively or in addition, the failed/failing spare segment may be powered down, removed from subsequent patrol scrubbing or otherwise isolated from future memory system operations. Where no uncorrectable error is indicated at 350, method 300 may end or, alternatively, proceed to additional operations (not shown)—e.g. wherein method 300 returns to another performance of the active rank scrub at 310.

In an embodiment, any operations performed in response to an error being detected at 350 may be independent of performance of one or more operations of a type performed in response to an error being detected at 320. The first handler process and the second handler process may be exclusive of one another, at least with respect to responding to uncorrectable error events for a spare segment versus an active segment. For example, of the first handler process and the second handler process, identification of an uncorrectable error at 320 may result in only the first handler process being invoked. Alternatively or in addition, of the first handler process and the second handler process, identification of an uncorrectable error at 350 may result in only the second handler process being invoked. The particular active status, versus spare status, of a given failed/failing segment may be a "but for" condition for selecting, at least from among the first handler process and the second handler process, which one (e.g. only one) of the two handler processes is to be invoked.

Figure 4A:
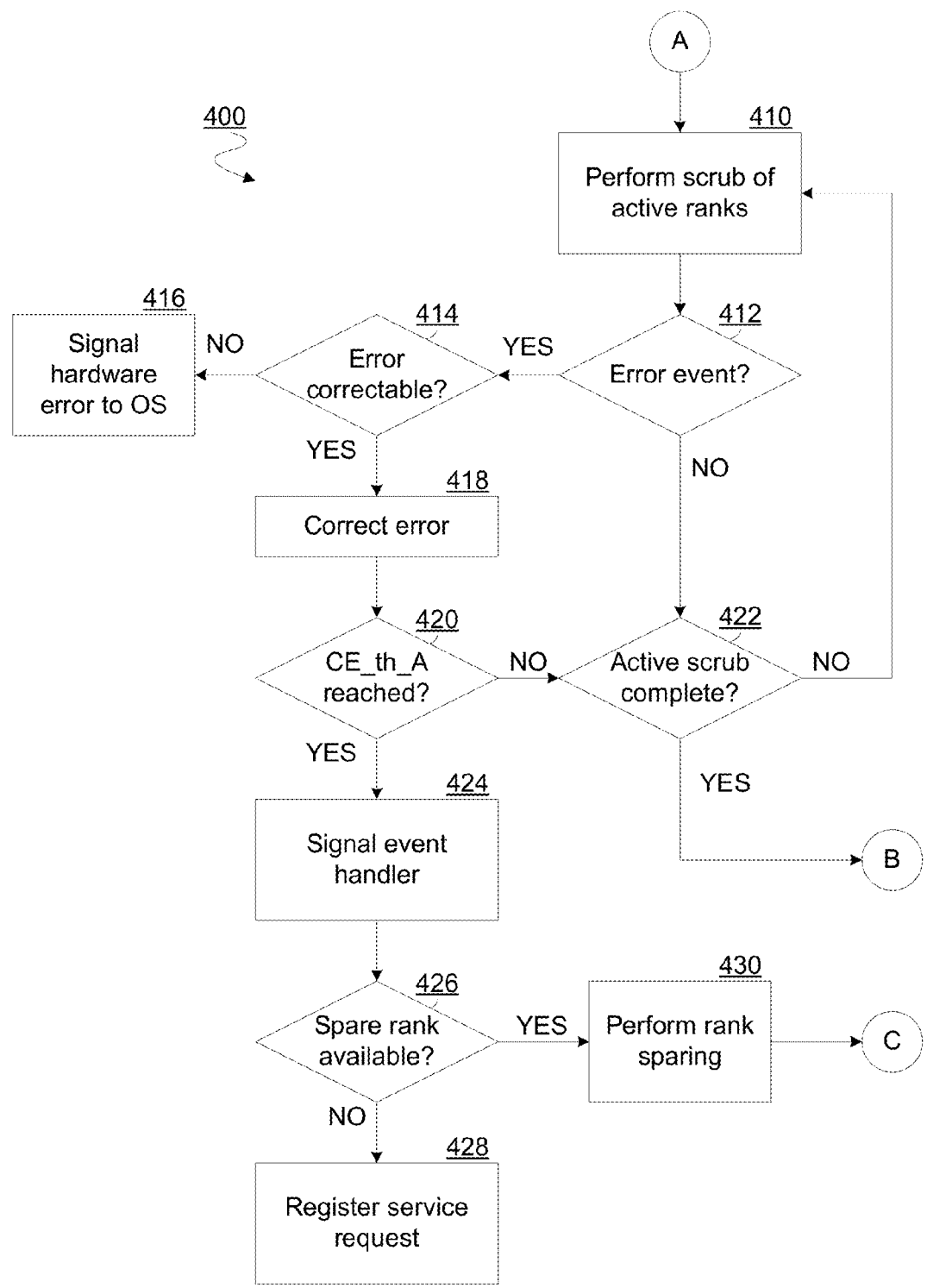
FIGS. 4A, 4B are flow diagrams each illustrating elements of a method for handling a memory error event according to an embodiment.

FIG. 4A illustrate elements of a method 400 for controlling a memory according to an embodiment. Method 400 may include some or all of the features of method 300, for example. In an embodiment, method 400 is performed at least in part with one or memory controllers 110, 200 (or other such controller logic) operating as a component of a hardware platform.

In an embodiment, method 400 includes, at 410, performing operations to scrub active ranks (or other such segments) of the platform memory—e.g. as discussed herein with reference to first scrub 310. In a sequence 480 shown in FIG. 4C, a "Scrub 1" of phase 482 illustrates one example of such scrubbing, for a scenario wherein a memory includes eight currently active ranks Rank0, . . . , Rank7. Method 400 may subsequently evaluate, at 412, whether a data error is indicated by (e.g. during) such a scrub. If no such data error is indicated at 412, then another evaluation is made at 422 as to whether the scrub of active ranks has completed. If the scrub is not completed, method 400 may continue active rank scrub operations at 410. Otherwise, method 400 may commence a transition to spare rank scrubbing operations, as discussed herein with reference to method 450 of FIG. 4B.

If a data error is indicated by the evaluation at 412, then method 400 may, at 414, determine whether (or not) the detected error is correctable. If it is indicated at 414 that the error is uncorrectable, then method 400 may, at 416, signal to a host OS of the platform the occurrence of a hardware error. The signaling at 416 may, for example, include signaling a machine check (or other) exception—e.g. as discussed herein with respect to the signaling at 330 of method 300. Handling of such an exception may include or result in a system crash, system reset or other such event which, in an embodiment, ends method 400.

If it is instead determined at 414 that the error event indicated at 412 is correctable, then method 400 may, at 418, perform error correction calculations to determine a corrected version of the corrupted data. Additionally, method 400 may determine, at 420, whether the error event detected at 412 constitutes the reaching (e.g. exceeding) of some error threshold CE_th_A such as a threshold number, percentage and/or frequency of correctable errors. The specific value (and/or type) of CE_th_A, which may be an a priori constraint, can vary widely according to implementation-specific details, and is not limiting on certain embodiment. If CE_th_A is not reached, then method 400 may return to the evaluation at 422 of whether active rank scrubbing has completed.

Where it is determined at 420 that CE_th_A has been reached, method 400 may, at 424, signal an event handler code to perform operations in support of memory sparing. Such a determination may be made, for example, during a subsequent recursion of method 400—e.g. during a "Scrub 3" (e.g. subsequent to Scrub 1) of a phase 484 illustrated in FIG. 4C. An event handler event signaled at 424 may, in some embodiments, be the same as one which might otherwise be signaled at 416. Alternatively, another event handler process may be signaled. By way of illustration and not limitation, a system management interrupt may be signaled for a processor to transition into a SMM—e.g., including transitioning away from a mode in which the host OS executes. The signaling performed at 424 may, in an embodiment, cause error handling firmware or other such logic to begin a transition from operations which evaluate, manage or otherwise target active ranks to operations which instead target one or more spare ranks.

For example, the signaling at 424 may result in or otherwise precede an evaluation, at 426, as to whether a spare rank is currently available. This evaluation is made in case all of the original one or more spare ranks were previously activated, and no replacement spare ranks were ever added to the memory sub-system. If it is determined at 426 that no spare ranks are available, then a service request may be registered at 428 with a management console or other software of the computer software—e.g. to provide notification that a DIMM or other memory device needs to be replaced during a next service call.

If it is instead determined at 426 that a spare rank is available, then rank sparing operations are initiated at 430. The rank sparing at 430 may include activating a spare rank identified at 426, and deactivating the failed/failing rank for which the activated spare is to serve as a replacement. After the rank sparing performed at 430, method 400 may register a service request, as discussed herein with reference to method 450. The spare rank to be activated may be ready for such activation (where the spare rank is not itself a failed/failing rank) by virtue of spare rank scrubbing performed in advance—e.g., according to method 450. For example, a memory sparing phase 486 of sequence 480 may activate spare rank Spare0 for service as the replacement active rank Rank0, where earlier Scrub 2 patrol scrubbing of Spare0 was performed to confirm eligibility of Spare0 for such activation.

Figure 4B:
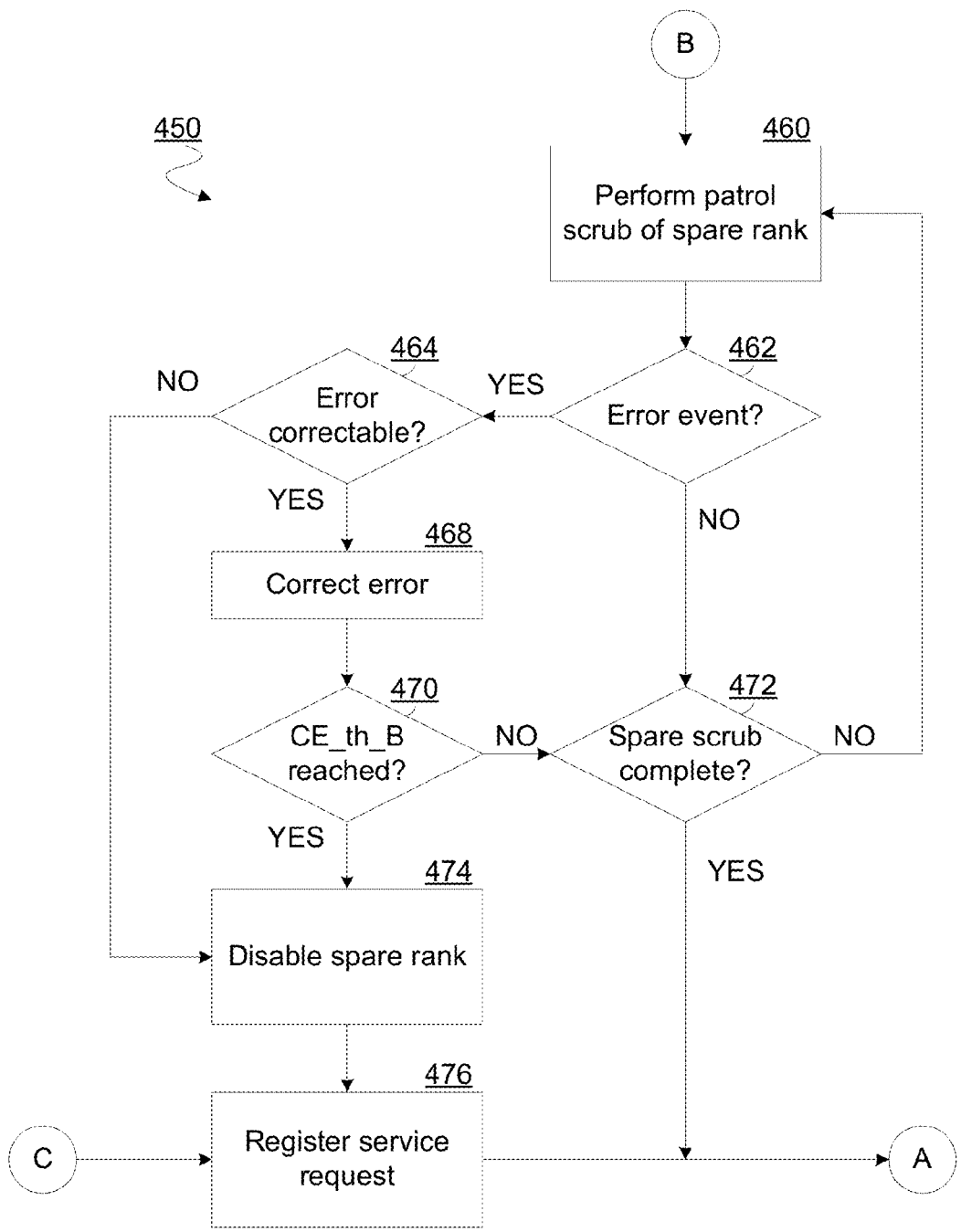
Figure 4C:
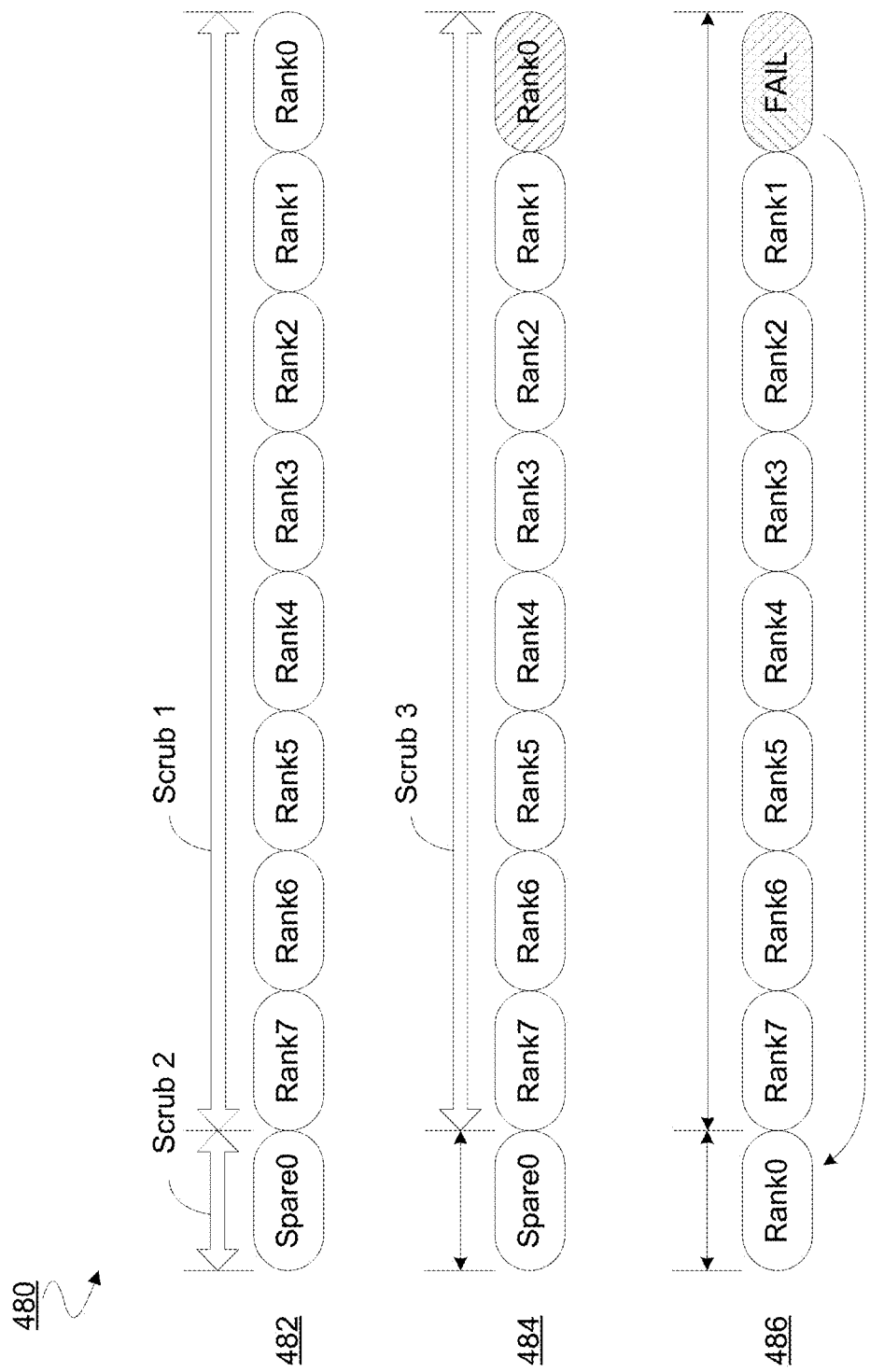
FIG. 4C is a functional block diagram illustrating elements of memory segment allocation performed according to an embodiment.

FIG. 4B illustrates elements of a method 450 for performing such spare rank scrubbing. Methods 400, 450 may be different portions of one larger method according to one embodiment. Method 450 may include, at 460, performing operations to patrol scrub (only) one or more spare ranks of the platform memory—e.g. as discussed herein with reference to scrubbing performed at 340 of method 300. An example of such patrol scrubbing in sequence 480 is represented by a "Scrub 2" (e.g. subsequent to Scrub 1 and/or prior to Scrub 3) of phase 482, wherein the memory includes only a single spare rank. Method 450 may subsequently evaluate, at 462, whether a data error is indicated by such a patrol scrub. If no such data error is indicated at 462, then another evaluation is made at 472 as to whether the spare rank patrol scrub has completed. If the scrub is not completed, method 450 may continue spare rank scrub operations at 460. Otherwise, method 450 may, in one embodiment, return to active patrol scrub operations such as those at 410 of method 400.

If a data error is indicated by the evaluation at 462, then method 450 may, at 464, determine whether (or not) the detected error is correctable. If it is indicated 464 that the error is uncorrectable, then method 450 may, at 474, disable the spare rank at least from being available as a future replacement for any failed/failing active rank. Operations at 474 may further comprise setting one or more configurations to decouple the spare rank from one or more supply voltage traces, to exclude the spare rank from future spare rank patrol scrubbing operations, to disable, gate or otherwise reduce clocking and/or the like.

If it is instead determined at 464 that the error event indicated at 462 is correctable, then method 450 may, at 468, perform error correction calculations to determine a corrected version of the corrupted data or a new ECC for the corrupted version of the data. Subsequent to (or even prior to or during) the correcting at 468, method 450 may determine, at 470, whether the error event detected at 462 constitutes the reaching (e.g. exceeding) of some error threshold CE_th_B, which may include CE_th_A or another such threshold value. If CE_th_B is not reached, then method 450 may return to the evaluation at 472 of whether spare rank scrubbing has completed.

Where it is determined at 470 that CE_th_B has been reached, method 450 may perform the operations at 474 to disable the spare rank. Additionally, method 500 may invoke a handler to register a service request, at 476, indicating (for example) that a DIMM or other memory device needs to be replaced during a next service call. In an embodiment, the operations at 476 may be variously performed at different times under various conditions—e.g. to register a need to replace a memory device including a failed/failing active rank as detected at 420 or, alternatively, to register a need to replace a memory device including a failed/failing spare rank as detected at 464 or at 470. Subsequently, method 450 may, in one embodiment, return to active patrol scrub operations such as those at 410 of method 400.

Figure 5A:
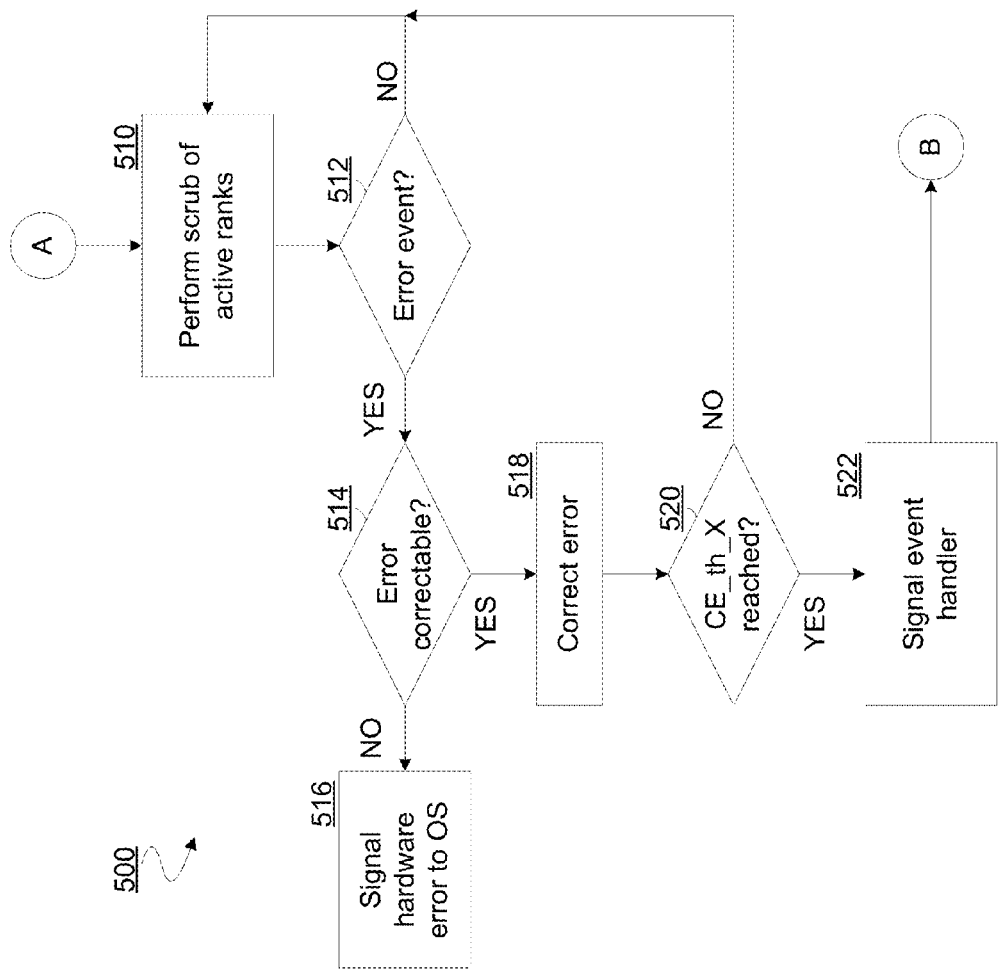
FIGS. 5A, 5B are flow diagrams each illustrating elements of a method for handling a memory error event according to an embodiment.

FIG. 5A illustrate elements of another method 500 for controlling a memory according to an embodiment. Method 500 may include some or all of the features of method 300, for example. In an embodiment, method 500 is performed to control a memory sub-system including a plurality of active ranks (or other segments) and a plurality of spare ranks (segments).

In an embodiment, method 500 includes, at 510, performing operations to scrub active ranks of the platform memory—e.g. as discussed herein with reference to first scrub 310. An example of such scrubbing, for a scenario wherein a memory includes eight currently active ranks, is illustrated by phase 592 of a sequence 590 shown in FIG. 5C. Method 500 may subsequently evaluate, at 512, whether a data error is indicated by (e.g. during) such a scrub. If no such data error is indicated at 512, then method 500 loops back to resume active rank scrubbing at 510. Otherwise, method 500 may, at 514, determine whether (or not) the detected error is correctable. If it is indicated 514 that the error is uncorrectable, then method 500 may, at 516, communicate to a host OS of the platform a hardware error or other signal to initiate a machine check, for example. If it is instead determined at 514 that the error event indicated at 512 is correctable, then method 500 may, at 518, perform error correction calculations to determine a corrected version of the corrupted data. Additionally, method 500 may determine, at 520, whether some error threshold CE_th_X (e.g. CE_th_A) has been reached. If CE_th_X is not reached, then method 500 may loop back to resume active rank scrubbing at 510.

Where it is determined at 520 that CE_th_X has been reached, method 500 may, at 524, signal an event handler which is to perform memory sparing operations or prepare for the possibility of such memory sparing operations. By way of illustration and not limitation, a system management interrupt may be signaled for a processor to transition into a SMM—e.g., including transitioning away from a mode in which the host OS executes. The signaling performed at 524 may, in an embodiment, cause error handling firmware or other such logic to begin a transition the processor from operations which evaluate, manage or otherwise target active ranks to operations which instead target one or more spare ranks. For example, as illustrated by phase method 594 of sequence 590, method 500 may identify an active Rank0 as failed/failing and, in response, transition to operations such as those of method 550 of FIG. 5B.

Figure 5B:
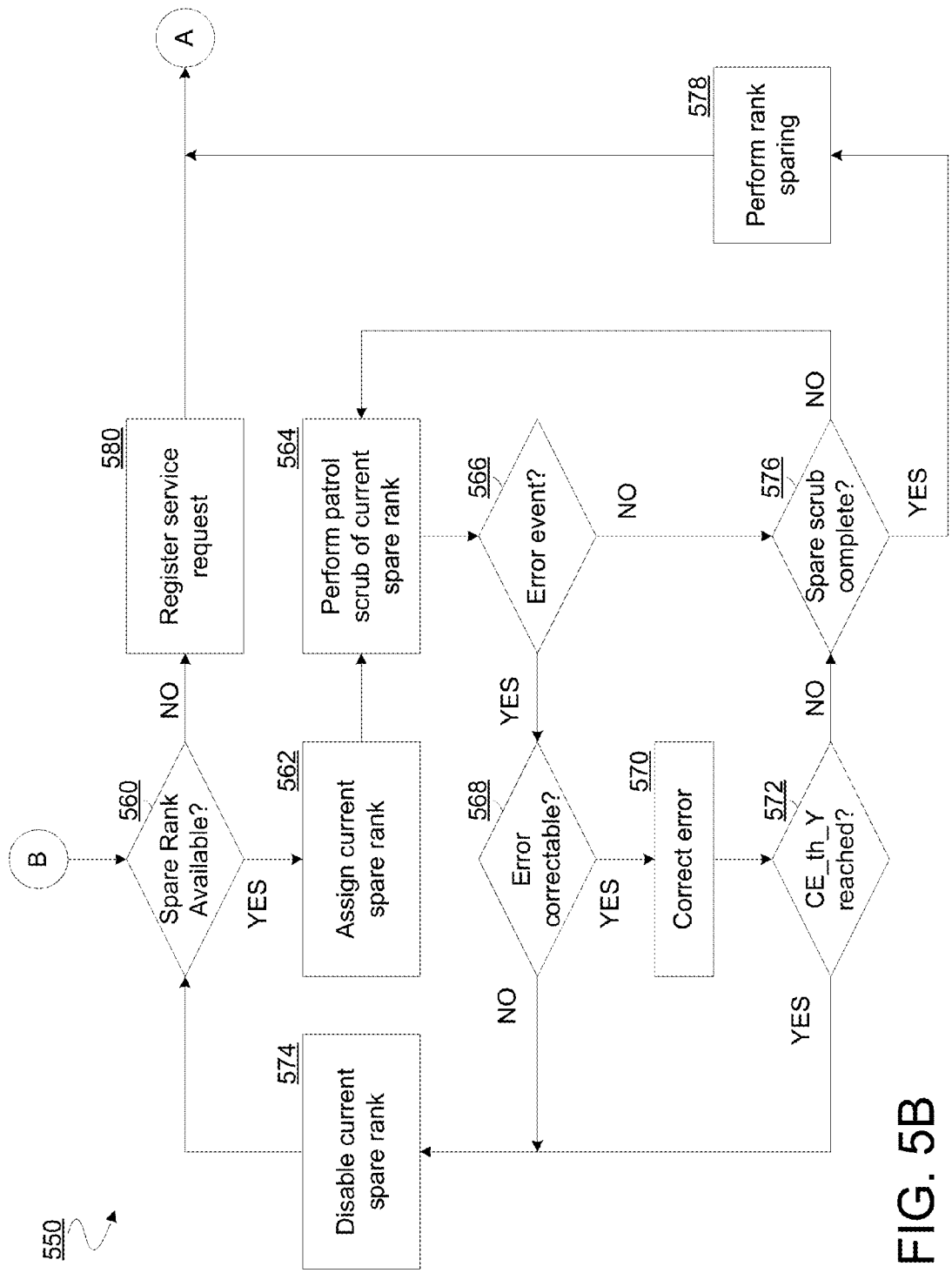
Figure 5C:
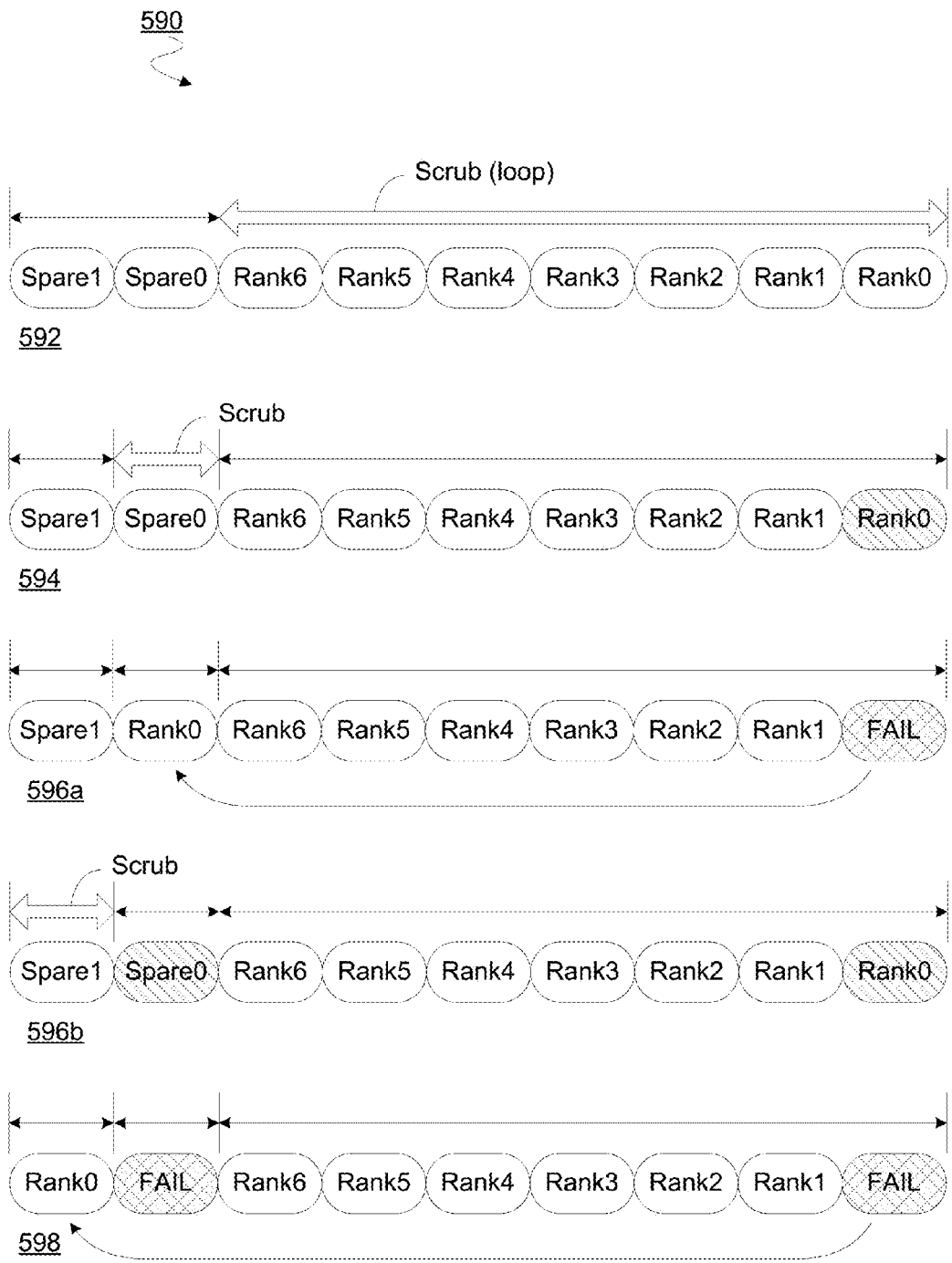
FIG. 5C is a functional block diagram illustrating elements of memory segment allocation performed according to an embodiment.

FIG. 5B illustrates elements of a method 550 for performing spare rank scrubbing. Methods 500, 550 may be different portions of one larger method according to one embodiment. In an embodiment, method 550 includes, at 560, determining whether there is a spare rank available for evaluation and possible selection as a replacement for the identified failed/failing rank. Where no spare rank is available, method 550 may, at 580, invoke a handler or other process to register a service request to indicate need to replace one or more DIMMs or other memory devices—e.g. to provide a new active rank, a new spare rank, or both.

Where it is determined at 560 that a spare rank is available to be evaluated, method 500 may, at 562, assign a spare rank detected at 560 to be the current spare rank under evaluation. Method 500 may then perform patrol scrubbing of the current spare rank, at 564. An example of such patrol scrubbing is represented in sequence 590 by phase 594, wherein the memory includes spare ranks Spare0, Spare1, wherein a current active Rank0 has been identified as failed/failing and wherein Spare0 is selected for patrol scrubbing. Method 550 may subsequently evaluate, at 566, whether a data error is indicated by such a patrol scrub. If no such data error is indicated at 566, then another evaluation is made at 576 as to whether the patrol scrub of the current spare rank has completed. If the scrub is not completed, method 550 may continue active rank scrub operations at 564. Otherwise, method 550 may, in one embodiment, implement a rank sparing at 578 to activate the current spare rank for service as a substitute for a failed/failing active rank (such as one detected at 520 of method 500). An example of one such memory sparing is illustrated in sequence 590 by phase 596a, wherein a spare rank Spare0 is activated to serve as the new active Rank0.

If a data error is indicated by the evaluation at 566, then method 550 may, at 568, determine whether (or not) the detected error is correctable. If it is indicated at 568 that the error is uncorrectable, then method 550 may, at 574, disable the current spare rank at least from being available as a future replacement for any failed/failing active rank. Operations at 574 may further comprise setting one or more configurations to decouple the current spare rank from a supply voltage trace and/or to exclude the current spare rank from future spare rank patrol scrubbing operations. An example of such spare rank disabling is represented in sequence 590 by phase 596b—e.g., an alternative to phase 596a—wherein Spare0 has instead been identified as a failed/failing rank, and another spare rank Spare1 is subsequently assigned as the current spare rank for evaluation. Subsequently, method 500 may return to evaluating 560 whether another spare rank may serve as the next current spare rank to be evaluated.

If it is instead determined at 568 that the error event indicated at 566 is correctable, then method 550 may, at 570, correct the error and, at 572, determine whether some error threshold CE_th_Y (e.g., CE_th_B) has been reached. Where CE_th_Y has been reached, method 550 may perform the operations at 574 to disable the spare rank. Otherwise, method 500 may proceed to a performance of the evaluation at 576. Phase 598 of sequence 590 illustrates a scenario wherein, subsequent to phase 596b, memory sparing at 578 causes spare rank Spare1 to be activated for service as a replacement Rank0.

Figure 6:
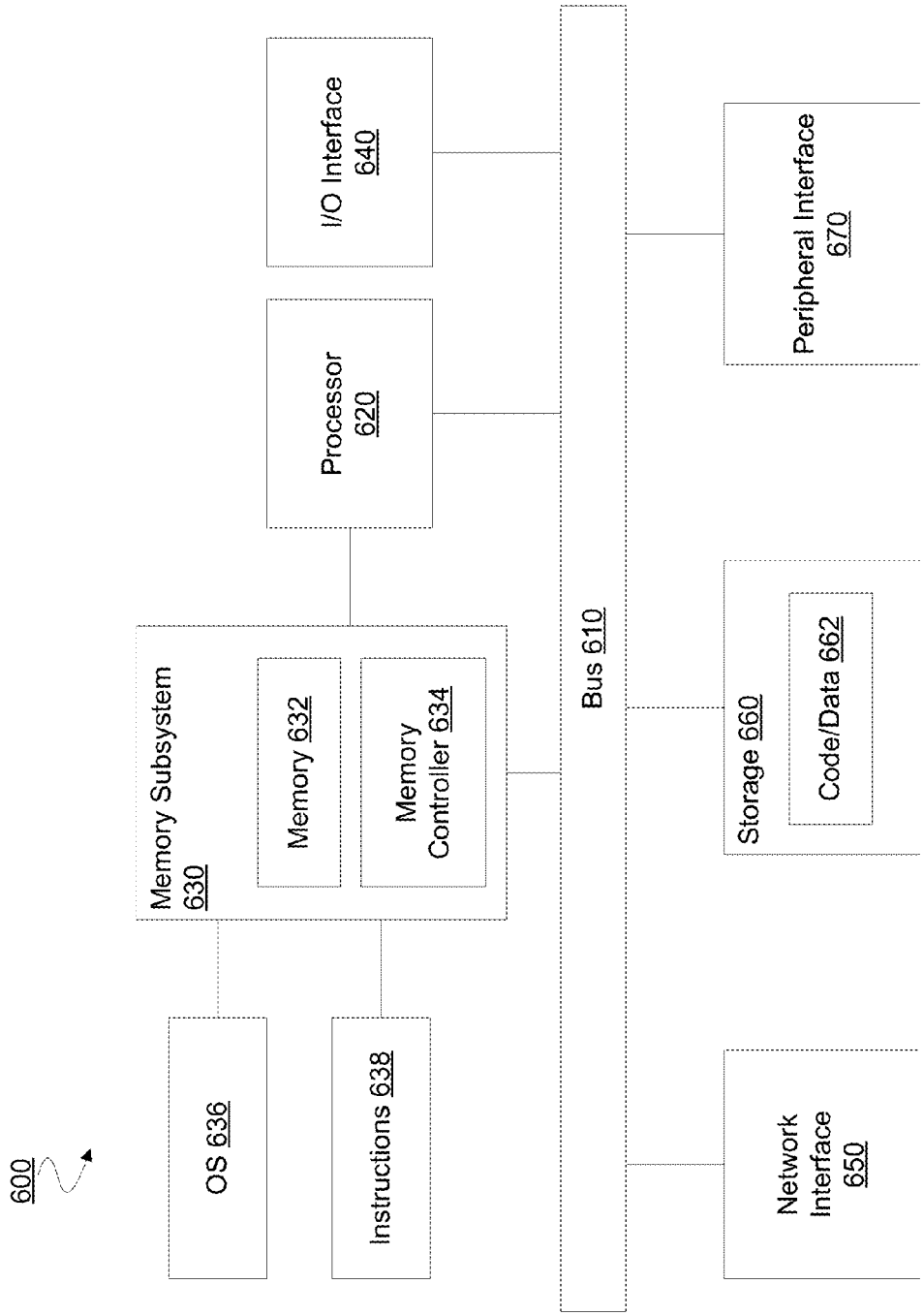
FIG. 6 is a functional block diagram illustrating elements of a computer system for controlling a memory according to an embodiment.

FIG. 6 is a block diagram of an embodiment of a computing system in which memory accesses may be implemented. System 600 represents a computing device in accordance with any embodiment described herein, and may be a laptop computer, a desktop computer, a server, a gaming or entertainment control system, a scanner, copier, printer, or other electronic device. System 600 may include processor 620, which provides processing, operation management, and execution of instructions for system 600. Processor 620 may include any type of microprocessor, central processing unit (CPU), processing core, or other processing hardware to provide processing for system 600. Processor 620 controls the overall operation of system 600, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 may include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620.

Memory subsystem 630 may include memory device 632 where it stores data, instructions, programs, or other items. In one embodiment, memory subsystem includes memory controller 634, which is a memory controller in accordance with any embodiment described herein, and which provides mechanisms for accessing memory device 632. In one embodiment, memory controller 634 provides commands to access memory device 632.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 may also correspond to interfaces in network interface 650.

System 600 may also include one or more input/output (I/O) interface(s) 640, network interface 650, one or more internal mass storage device(s) 660, and peripheral interface 670 coupled to bus 610. I/O interface 640 may include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 may include an Ethernet adapter, wireless interconnection components, USB (universal serial bus), or other wired or wireless standards-based or proprietary interfaces.

Storage 660 may be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 may be generically considered to be a "memory," although memory 630 is the executing or operating memory to provide instructions to processor 620. Whereas storage 660 is nonvolatile, memory 630 may include volatile memory (i.e., the value or state of the data is indeterminate if power is interrupted to system 600).

Peripheral interface 670 may include any hardware interface not specifically mentioned above. Peripherals refer generally to devices that connect dependently to system 600. A dependent connection is one where system 600 provides the software and/or hardware platform on which an operation executes, and with which a user interacts.

Figure 7:
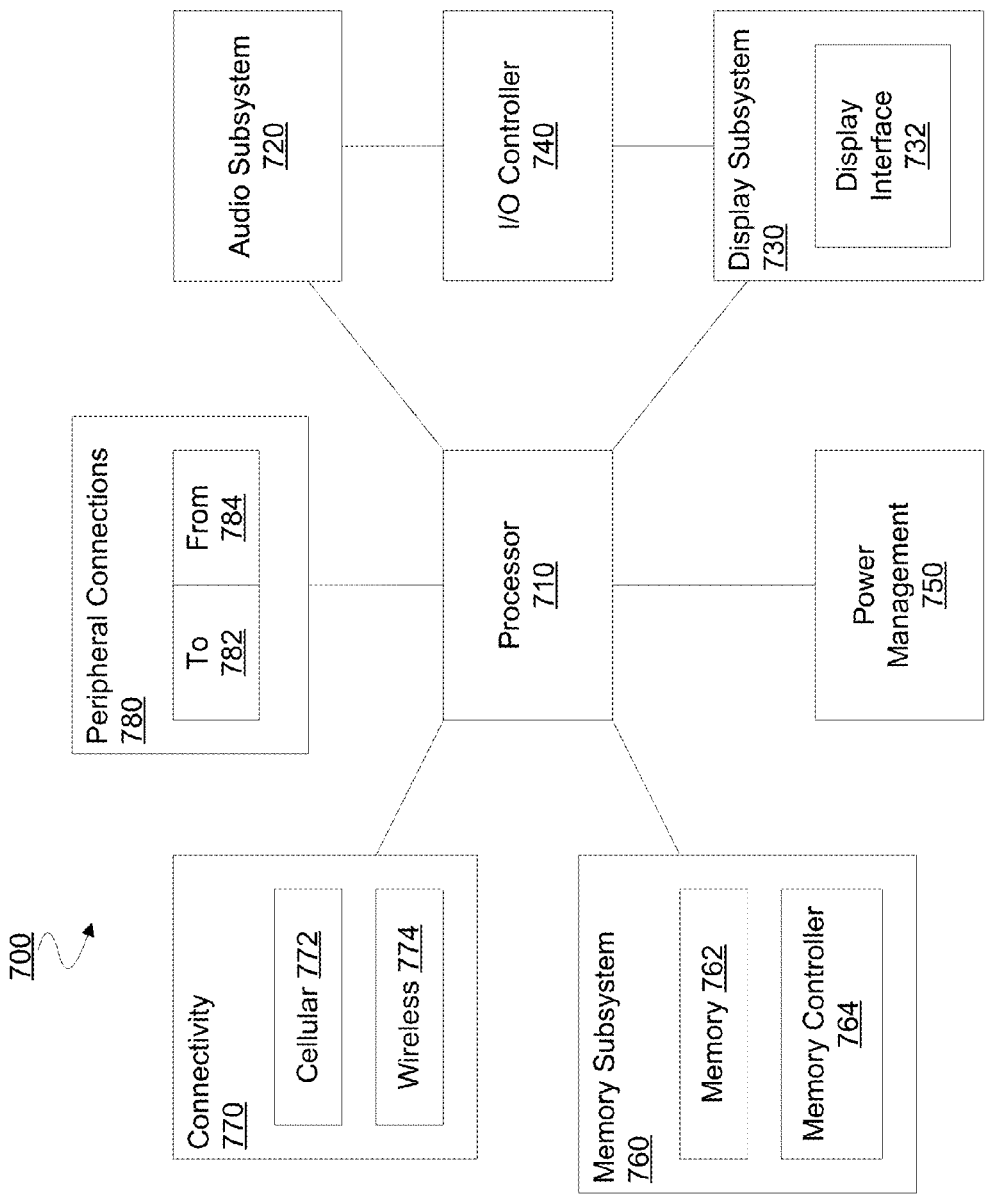
FIG. 7 is a functional block diagram illustrating elements of a mobile platform for controlling a memory according to an embodiment.

FIG. 7 is a block diagram of an embodiment of a mobile device in which memory accesses may be implemented. Device 700 represents a mobile computing device, such as a computing tablet, a mobile phone or smartphone, a wireless-enabled e-reader, or other mobile device. It will be understood that certain of the components are shown generally, and not all components of such a device are shown in device 700.

Device 700 may include processor 710, which performs the primary processing operations of device 700. Processor 710 may include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations may also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 may include display interface 732, which may include the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user.

I/O controller 740 represents hardware devices and software components related to interaction with a user. I/O controller 740 may operate to manage hardware that is part of audio subsystem 720 and/or display subsystem 730. Additionally, I/O controller 740 illustrates a connection point for additional devices that connect to device 700 through which a user might interact with the system. For example, devices that may be attached to device 700 might include microphone devices, speaker or stereo systems, video systems or other display device, keyboard or keypad devices, or other I/O devices for use with specific applications such as card readers or other devices.

As mentioned above, I/O controller 740 may interact with audio subsystem 720 and/or display subsystem 730. For example, input through a microphone or other audio device may provide input or commands for one or more applications or functions of device 700. Additionally, audio output may be provided instead of or in addition to display output. In another example, if display subsystem includes a touchscreen, the display device also acts as an input device, which may be at least partially managed by I/O controller 740. There may also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that may be included in device 700. The input may be part of direct user interaction, as well as providing environmental input to the system to influence its operations (such as filtering for noise, adjusting displays for brightness detection, applying a flash for a camera, or other features).

In one embodiment, device 700 includes power management 750 that manages battery power usage, charging of the battery, and features related to power saving operation. Memory subsystem 760 may include memory device(s) 762 for storing information in device 700. Memory subsystem 760 may include nonvolatile (state does not change if power to the memory device is interrupted) and/or volatile (state is indeterminate if power to the memory device is interrupted) memory devices. Memory 760 may store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710) to control memory 762.

Connectivity 770 may include hardware devices (e.g., wireless and/or wired connectors and communication hardware) and software components (e.g., drivers, protocol stacks) to enable device 700 to communicate with external devices. The device could be separate devices, such as other computing devices, wireless access points or base stations, as well as peripherals such as headsets, printers, or other devices.

Connectivity 770 may include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector may allow device 700 to connect to certain peripherals that allow device 700 to control content output, for example, to audiovisual or other systems.

In addition to a proprietary docking connector or other proprietary connection hardware, device 700 may make peripheral connections 780 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one implementation, a memory controller comprises scrubber logic comprising circuitry to perform a first patrol scrub of a plurality of active segments of a memory, and to perform a second patrol scrub of one or more segments of the platform while the one or more segments are each available as a spare segment for the plurality of active segments. The memory controller further comprises sparer logic comprising circuitry to receive an indication of a first uncorrectable error event detected based on the first patrol scrub, wherein, of a first handler process and a second handler process, the sparer logic to signal only the first handler process in response to the indication of the first uncorrectable error event, the sparer logic further to receive an indication of a second uncorrectable error event detected based on the second patrol scrub, wherein, of the first handler process and the second handler process, the sparer logic to signal only the second handler process in response to the indication of the second uncorrectable error event.

In an embodiment, the first handler process includes a machine check exception handler. In another embodiment, the second handler process includes an interrupt handler. In another embodiment, the second handler process registers a service request to replace a memory device. In another embodiment, the first handler process is executed during execution of a host operating system by a processor, and the second handler process is executed during a system management mode of the processor. In another embodiment, the sparer logic is further to signal a handler process other than the first process if a threshold correctable error event is detected based on the first patrol scrub, wherein any handler process signaled in response to the threshold correctable error event is a handler process other than the first handler process. In another embodiment, the sparer logic to signal the handler process other than the first process includes the sparer logic to signal a handler process executed during a system management mode of a processor.

In another implementation, a method comprises performing first patrol scrubbing of a plurality of active segments of a memory, and if an uncorrectable error event is detected based on the first patrol scrubbing, then signaling a first handler process, wherein, of the first handler process and a second handler process, only the first handler process is signaled in response to the uncorrectable error event detected by the first patrol scrubbing. The method further comprises performing second patrol scrubbing of one or more segments of the memory while the one or more segments are each available as a spare segment for the plurality of active segments, and if an uncorrectable error event is detected based on the second patrol scrubbing, then signaling the second handler process, wherein, of the first handler process and a second handler process, only the first handler process is signaled in response to the uncorrectable error event detected by the first patrol scrubbing.

In an embodiment, the first handler process includes a machine check exception handler. In another embodiment, the second handler process includes an interrupt handler. In another embodiment, the second handler process registers a service request to replace a memory device. In another embodiment, the first handler process is executed during execution of a host operating system by a processor, and the second handler process is executed during a system management mode of the processor. In another embodiment, the method further comprises, if a threshold correctable error event is detected based on the first patrol scrubbing, then signaling a handler process other than the first process, wherein any handler process signaled in response to the threshold correctable error event is a handler process other than the first handler process. In another embodiment, signaling the handler process other than the first process includes signaling a handler process executed during a system management mode of a processor.

In another implementation, a system comprises one or more memory devices, an interconnect, and a memory controller coupled to the one or more memory devices via the interconnect, the memory controller to control the one or more memory devices. The memory controller includes scrubber logic comprising circuitry to perform first patrol scrubbing of a plurality of active segments of the one or more memory devices, and to perform second patrol scrubbing of one or more segments of the one or more memory devices while the one or more segments are each available as a spare segment for the plurality of active segments. The memory controller further comprises sparer logic comprising circuitry to receive an indication of a first uncorrectable error event detected based on the first patrol scrubbing, wherein, of a first handler process and a second handler process, the sparer logic to signal only the first handler process in response to the indication of the first uncorrectable error event, the sparer logic further to receive an indication of a second uncorrectable error event detected based on the second patrol scrubbing, wherein, of the first handler process and the second handler process, the sparer logic to signal only the second handler process in response to the indication of the second uncorrectable error event.

In an embodiment, the first handler process includes a machine check exception handler. In another embodiment, the second handler process includes an interrupt handler. In another embodiment, the second handler process registers a service request to replace a memory device. In another embodiment, the first handler process is executed during execution of a host operating system by a processor, and the second handler process is executed during a system management mode of the processor. In another embodiment, the sparer logic is further to signal a handler process other than the first process if a threshold correctable error event is detected based on the first scrub, wherein any handler process signaled in response to the threshold correctable error event is a handler process other than the first handler process.

In another implementation, a computer-readable storage medium having stored thereon instructions which, when executed by one or more processing units, cause the one or more processing units to perform a method comprising performing first patrol scrubbing of a plurality of active segments of a memory, and if an uncorrectable error event is detected based on the first patrol scrubbing, then signaling a first handler process, wherein, of the first handler process and a second handler process, only the first handler process is signaled in response to the uncorrectable error event detected by the first patrol scrubbing. The method further comprises performing second patrol scrubbing of one or more segments of the memory while the one or more segments are each available as a spare segment for the plurality of active segments, and if an uncorrectable error event is detected based on the second patrol scrubbing, then signaling the second handler process, wherein, of the first handler process and a second handler process, only the first handler process is signaled in response to the uncorrectable error event detected by the first patrol scrubbing.

In an embodiment, the first handler process includes a machine check exception handler. In another embodiment, the second handler process includes an interrupt handler. In another embodiment, the second handler process registers a service request to replace a memory device. In another embodiment, the first handler process is executed during execution of a host operating system by a processor, and the second handler process is executed during a system management mode of the processor.

Techniques and architectures for controlling a memory are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A memory controller comprising:
scrubber logic comprising circuitry to perform a first patrol scrub of a plurality of active segments of a memory, and to perform a second patrol scrub of one or more segments of the memory while the one or more segments are each available as a spare segment for the plurality of active segments; and
sparer logic comprising circuitry to receive an indication of a first uncorrectable error event detected based on the first patrol scrub, wherein, of a first handler process and a second handler process, the sparer logic to signal only the first handler process in response to the indication of the first uncorrectable error event, the sparer logic further to receive an indication of a second uncorrectable error event detected based on the second patrol scrub, wherein, of the first handler process and the second handler process, the sparer logic to signal only the second handler process in response to the indication of the second uncorrectable error event.

2. The memory controller of claim 1, wherein the first handler process includes a machine check exception handler.

3. The memory controller of claim 1, wherein the second handler process includes an interrupt handler.

4. The memory controller of claim 1, wherein the second handler process registers a service request to replace a memory device.

5. The memory controller of claim 1, wherein the first handler process is executed during execution of a host operating system by a processor, and wherein the second handler process is executed during a system management mode of the processor.

6. The memory controller of claim 1, the sparer logic further to signal a handler process other than the first handler process if a threshold correctable error event is detected based on the first patrol scrub, wherein any handler process signaled in response to the threshold correctable error event is a handler process other than the first handler process.

7. The memory controller of claim 6, wherein the sparer logic to signal the handler process other than the first handler process includes the sparer logic to signal a handler process executed during a system management mode of a processor.

8. A method comprising:
performing first patrol scrubbing of a plurality of active segments of a memory;
if an uncorrectable error event is detected based on the first patrol scrubbing, then signaling a first handler process, wherein, of the first handler process and a second handler process, only the first handler process is signaled in response to the uncorrectable error event detected by the first patrol scrubbing;
performing second patrol scrubbing of one or more segments of the memory while the one or more segments are each available as a spare segment for the plurality of active segments; and
if an uncorrectable error event is detected based on the second patrol scrubbing, then signaling the second handler process, wherein, of the first handler process and a second handler process, only the first handler process is signaled in response to the uncorrectable error event detected by the first patrol scrubbing.

9. The method of claim 8, wherein the first handler process includes a machine check exception handler.

10. The method of claim 8, wherein the second handler process includes an interrupt handler.

11. The method of claim 8, wherein the second handler process registers a service request to replace a memory device.

12. The method of claim 8, wherein the first handler process is executed during execution of a host operating system by a processor, and wherein the second handler process is executed during a system management mode of the processor.

13. The method of claim 8, further comprising:
if a threshold correctable error event is detected based on the first patrol scrubbing, then signaling a handler process other than the first handler process, wherein any handler process signaled in response to the threshold correctable error event is a handler process other than the first handler process.

14. The method of claim 13, wherein signaling the handler process other than the first handler process includes signaling a handler process executed during a system management mode of a processor.

15. A system comprising:
one or more memory devices;
an interconnect; and
a memory controller coupled to the one or more memory devices via the interconnect, the memory controller to control the one or more memory devices, the memory controller including:
scrubber logic comprising circuitry to perform first patrol scrubbing of a plurality of active segments of the one or more memory devices, and to perform second patrol scrubbing of one or more segments of the one or more memory devices while the one or more segments are each available as a spare segment for the plurality of active segments; and
sparer logic comprising circuitry to receive an indication of a first uncorrectable error event detected based on the first patrol scrubbing, wherein, of a first handler process and a second handler process, the sparer logic to signal only the first handler process in response to the indication of the first uncorrectable error event, the sparer logic further to receive an indication of a second uncorrectable error event detected based on the second patrol scrubbing, wherein, of the first handler process and the second handler process, the sparer logic to signal only the second handler process in response to the indication of the second uncorrectable error event.

16. The system of claim 15, wherein the first handler process includes a machine check exception handler.

17. The system of claim 15, wherein the second handler process includes an interrupt handler.

18. The system of claim 15, wherein the second handler process registers a service request to replace a memory device.

19. The system of claim 15, wherein the first handler process is executed during execution of a host operating system by a processor, and wherein the second handler process is executed during a system management mode of the processor.

20. The system of claim 15, the sparer logic further to signal a handler process other than the first handler process if a threshold correctable error event is detected based on the first scrub, wherein any handler process signaled in response to the threshold correctable error event is a handler process other than the first handler process.

21. A non-transitory computer-readable storage medium having stored thereon instructions which, when executed by one or more processing units, cause the one or more processing units to perform a method comprising:
performing first patrol scrubbing of a plurality of active segments of a memory;
if an uncorrectable error event is detected based on the first patrol scrubbing, then signaling a first handler process, wherein, of the first handler process and a second handler process, only the first handler process is signaled in response to the uncorrectable error event detected by the first patrol scrubbing;
performing second patrol scrubbing of one or more segments of the memory while the one or more segments are each available as a spare segment for the plurality of active segments; and
if an uncorrectable error event is detected based on the second patrol scrubbing, then signaling the second handler process, wherein, of the first handler process and a second handler process, only the first handler process is signaled in response to the uncorrectable error event detected by the first patrol scrubbing.

22. The computer-readable storage medium of claim 21, wherein the first handler process includes a machine check exception handler.

23. The computer-readable storage medium of claim 21, wherein the second handler process includes an interrupt handler.

24. The computer-readable storage medium of claim 21, wherein the second handler process registers a service request to replace a memory device.

25. The computer-readable storage medium of claim 21, wherein the first handler process is executed during execution of a host operating system by a processor, and wherein the second handler process is executed during a system management mode of the processor.

* * * * *